United States Patent [19]

Yamazaki

[11] Patent Number: 5,567,249
[45] Date of Patent: Oct. 22, 1996

[54] PHOTOELECTRIC CONVERSION DEVICE

[75] Inventor: Shunpei Yamazaki, Tokyo, Japan

[73] Assignee: Semiconductor Energy Laboratory Co., Ltd., Kanagawa-ken, Japan

[21] Appl. No.: 505,960

[22] Filed: Jul. 24, 1995

Related U.S. Application Data

[62] Division of Ser. No. 222,954, Apr. 5, 1994, which is a division of Ser. No. 13,209, Feb. 1, 1993, Pat. No. 5,332,450, which is a continuation of Ser. No. 839,067, Feb. 20, 1992, abandoned, which is a continuation of Ser. No. 800,666, Nov. 22, 1985, abandoned, which is a division of Ser. No. 630,063, Jul. 12, 1984, Pat. No. 4,594,471.

[30] Foreign Application Priority Data

| Jul. 13, 1983 | [JP] | Japan | 58-128270 |
| Oct. 31, 1983 | [JP] | Japan | 58-204441 |
| Mar. 26, 1984 | [JP] | Japan | 59-57713 |

[51] Int. Cl.[6] .................................................. H01C 31/05
[52] U.S. Cl. ................................... 136/249; 136/244
[58] Field of Search ............................ 136/244, 249 MS

[56] References Cited

U.S. PATENT DOCUMENTS

| | | | |
|---|---|---|---|
| 3,483,038 | 12/1969 | Hui et al. | 136/244 |
| 4,044,222 | 8/1977 | Kestenbaum | 219/121 |
| 4,243,432 | 1/1981 | Jordan et al. | 136/244 |
| 4,245,386 | 1/1981 | Kausche et al. | 437/2 |
| 4,259,367 | 3/1981 | Dougherty, Jr. | 427/26 |
| 4,281,208 | 7/1981 | Kuwano et al. | 136/249 |
| 4,292,092 | 9/1981 | Hanak | 437/2 |
| 4,315,096 | 2/1982 | Tyan et al. | 136/244 |
| 4,333,226 | 6/1982 | Abe et al. | |
| 4,428,110 | 1/1984 | Kim | 437/2 |
| 4,443,651 | 4/1984 | Swartz | 136/249 |
| 4,443,685 | 4/1984 | Seman | |
| 4,485,264 | 11/1984 | Izu et al. | 136/244 |
| 4,517,403 | 5/1985 | Morel et al. | 136/249 MS |
| 4,518,815 | 5/1985 | Yamazaki | 136/244 |
| 4,532,371 | 7/1985 | Hanak et al. | 136/249 |
| 4,594,471 | 6/1986 | Yamazaki | 136/249 MS |
| 4,603,470 | 8/1986 | Yamazaki | 437/2 |
| 4,612,409 | 9/1986 | Hamakawa et al. | 136/244 |
| 5,332,450 | 7/1994 | Yamazaki | 136/249 MS |
| 5,332,680 | 7/1994 | Yamazaki | 437/2 |

FOREIGN PATENT DOCUMENTS

| 55-108780 | 8/1980 | Japan | 136/258 AM |
| 57-163753 | 10/1982 | Japan | 136/258 AM |

OTHER PUBLICATIONS

Yamazaki et al. in Conf. Record, 17th IEEE Photovoltaic Specialist Conf., Kissimmee, FL. May 1–4, 1984, pp. 206–211.

Primary Examiner—Aaron Weisstuch
Attorney, Agent, or Firm—Sixbey, Friedman, Leedom & Ferguson, PC; Gerald J. Ferguson, Jr.; Jeffrey L. Costellia

[57] ABSTRACT

A plurality of first electrodes are sequentially arranged on a substrate and covered with a non-single-crystal semiconductor laminate member. On the semiconductor laminate member are formed second electrodes respectively corresponding to the first electrodes. Each first electrode and each second electrode and the region of the semiconductor laminate member sandwiched therebetween constitute one semiconductor photoelectric transducer. The transducer is connected to another transducer adjacent thereto so that the second electrode of the latter is connected to the first electrode of the former through a contact portion extending thereto from the second electrode of the latter into a contact groove cut in the semiconductor laminate member. In this case, the contact groove and the contact portion are not exposed in the side walls of the semiconductor laminate member. The side walls of the first and/or second electrode are retained inside the side walls of the substrate.

The first electrodes, the second electrodes and the contact grooves are defined by a laser beam.

8 Claims, 8 Drawing Sheets

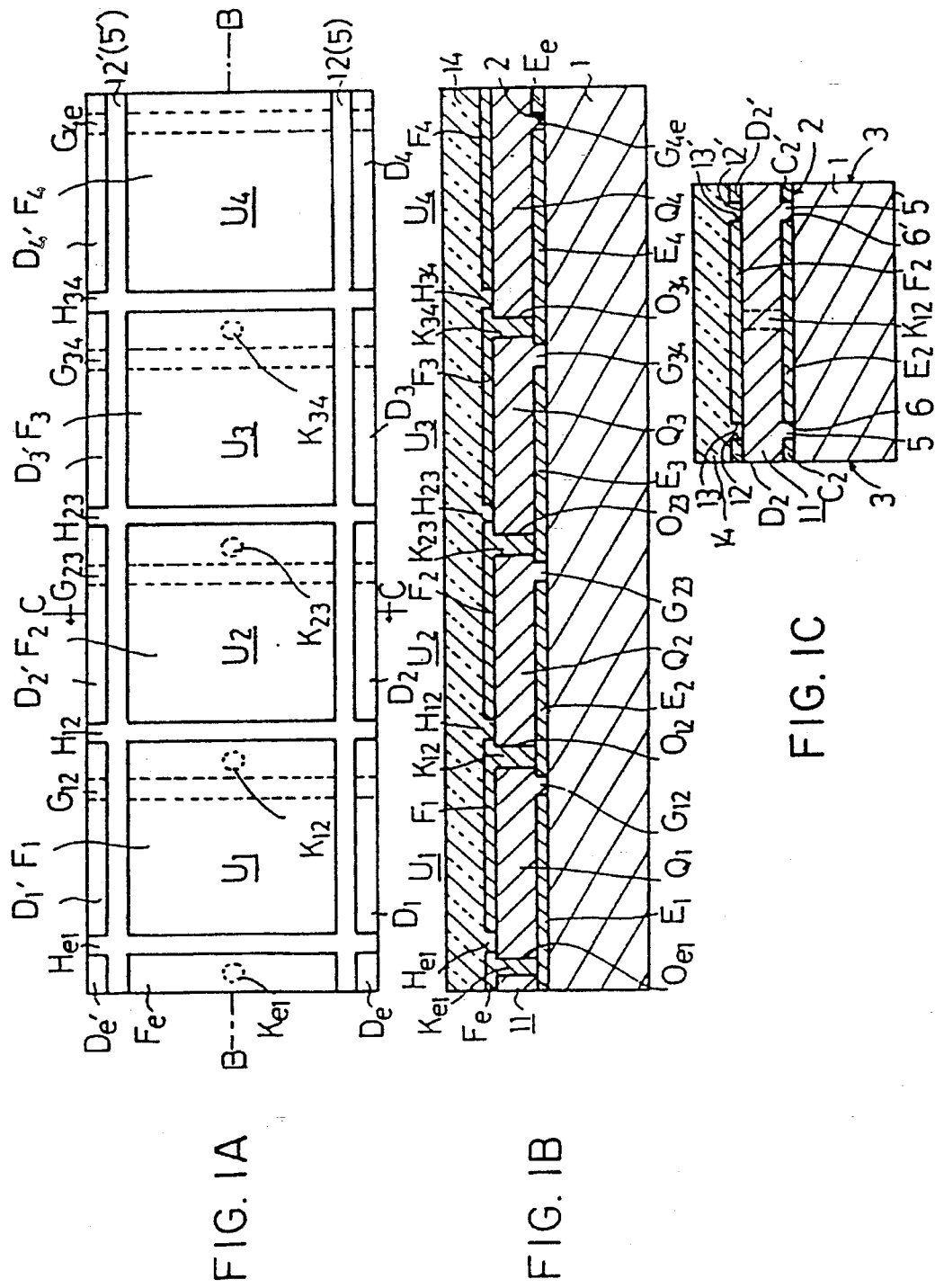

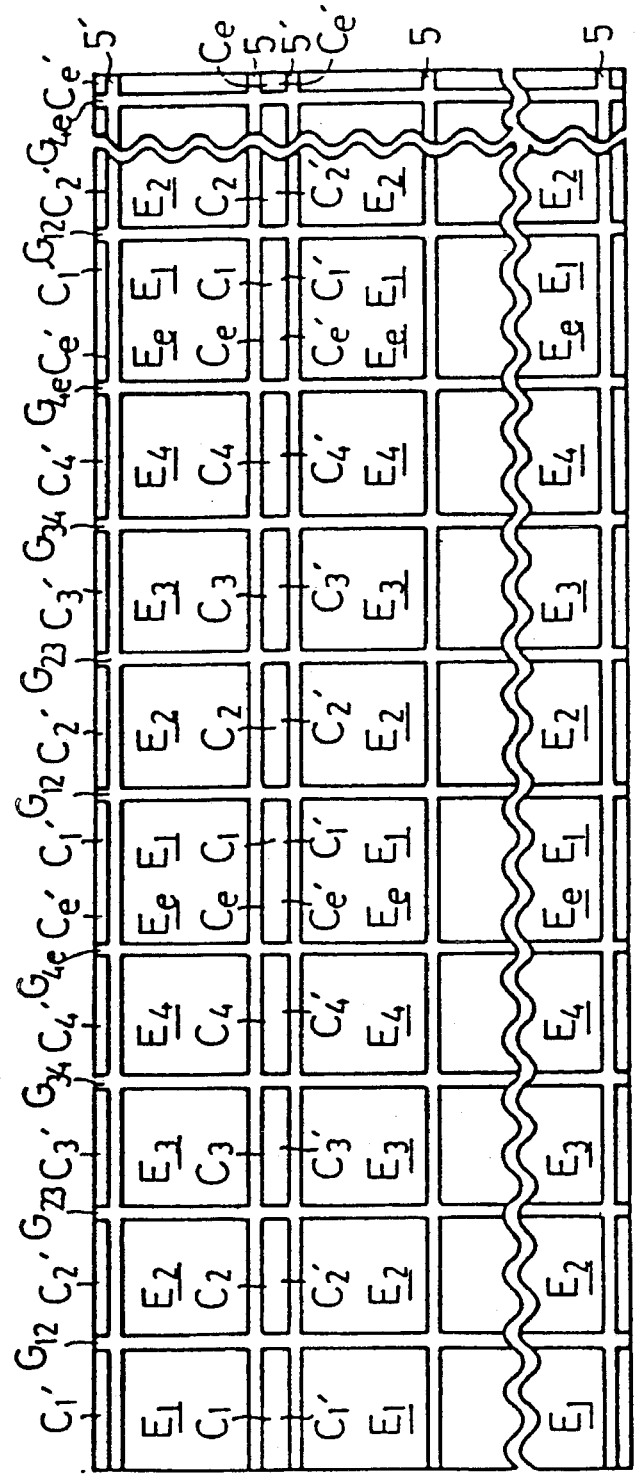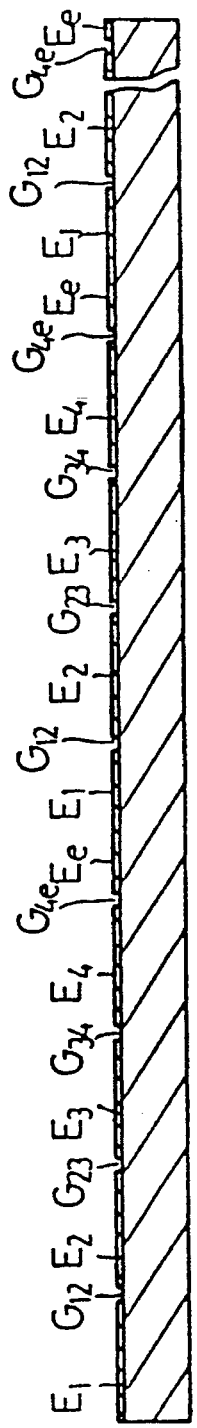
FIG. 4A
FIG. 4B

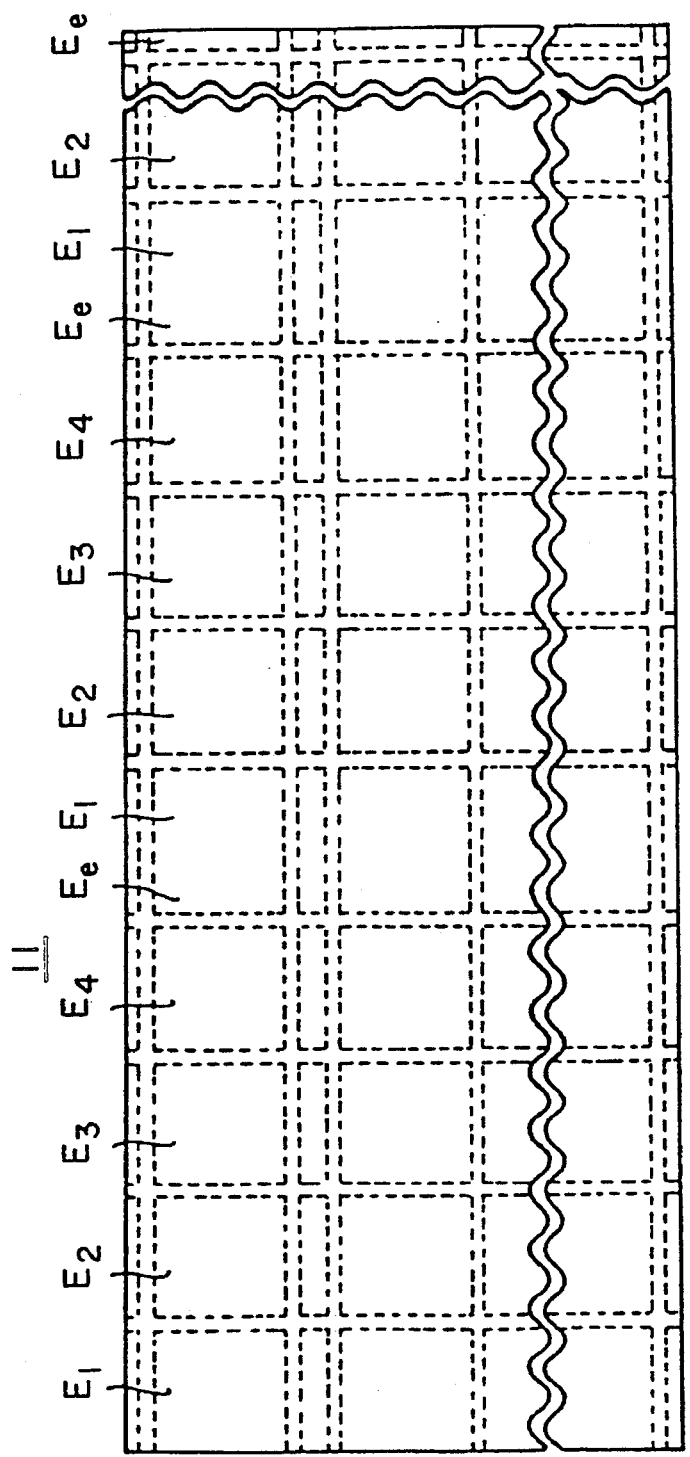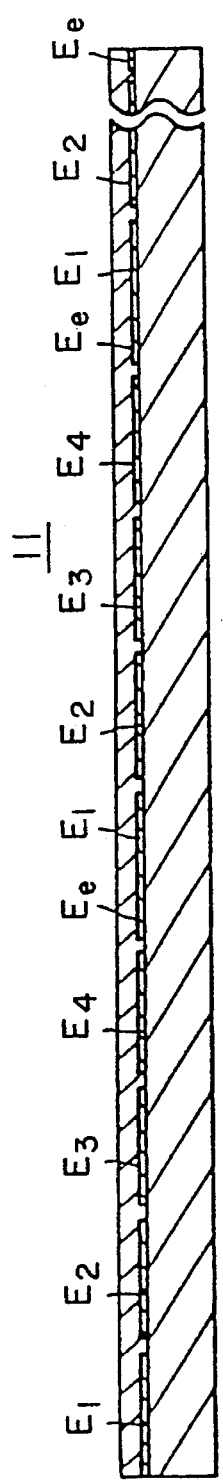
FIG. 5A
FIG. 5B

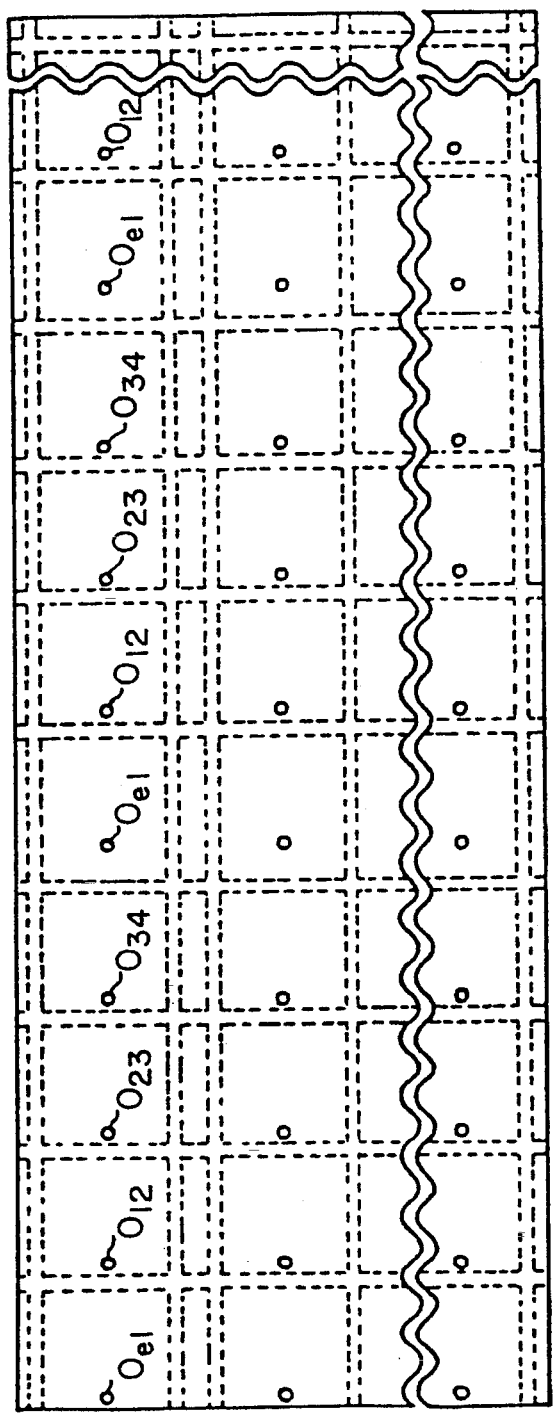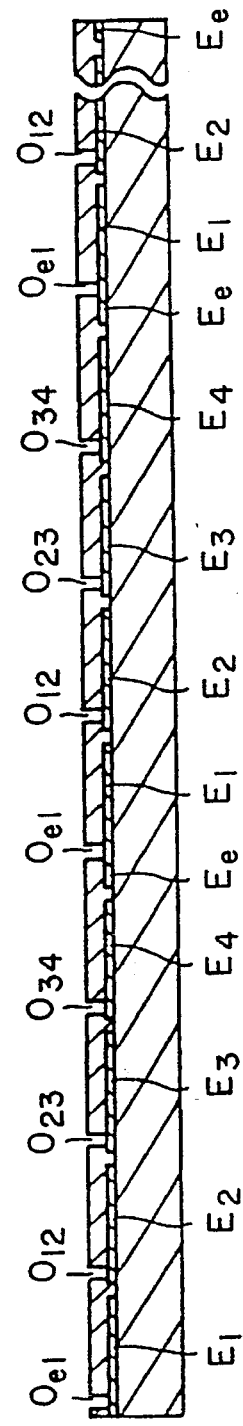
FIG. 6A
FIG. 6B

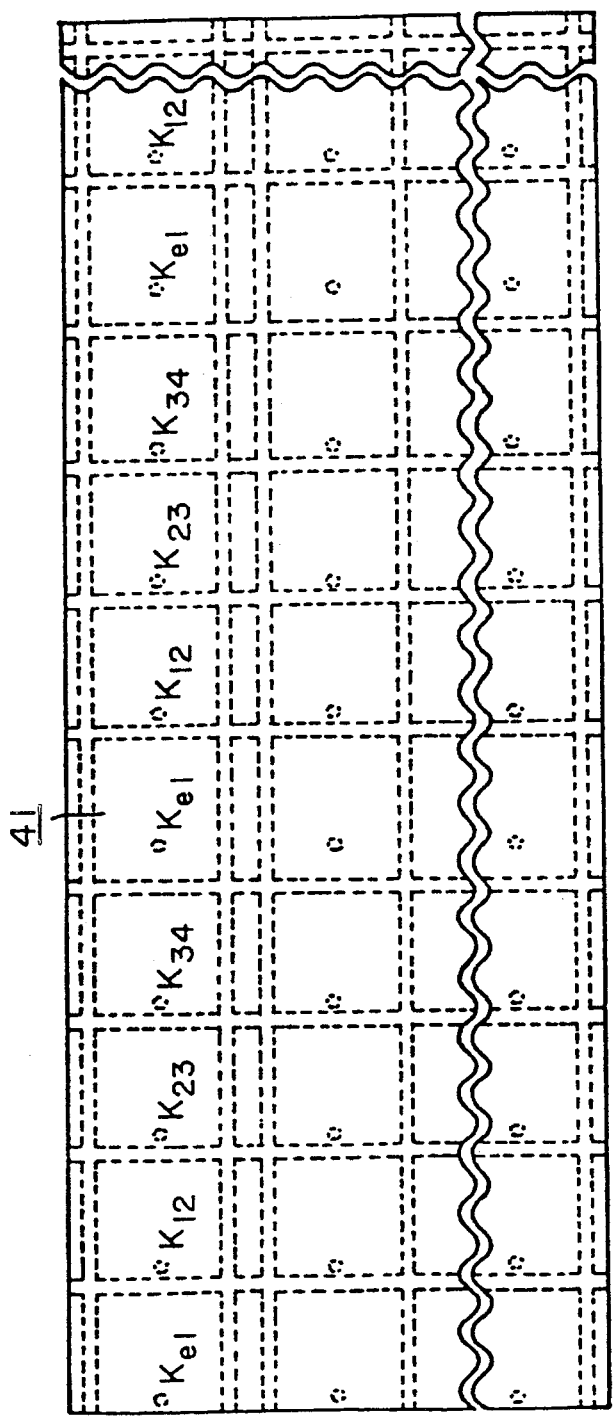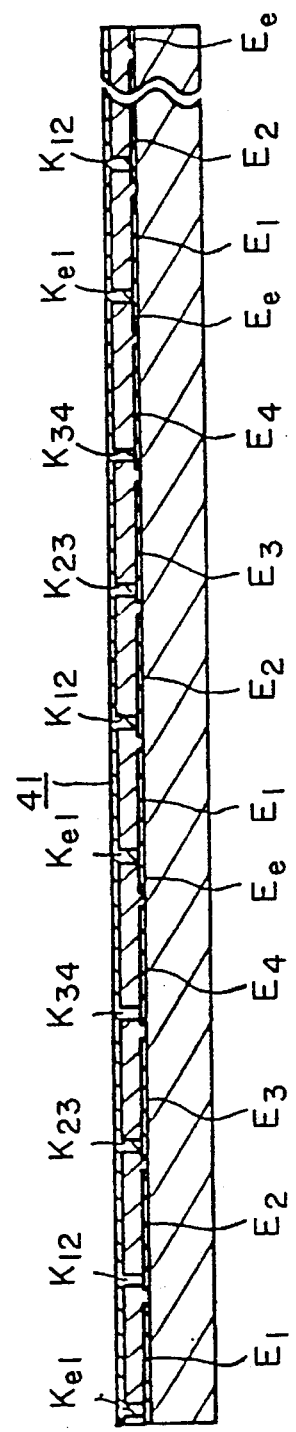
FIG. 7A
FIG. 7B

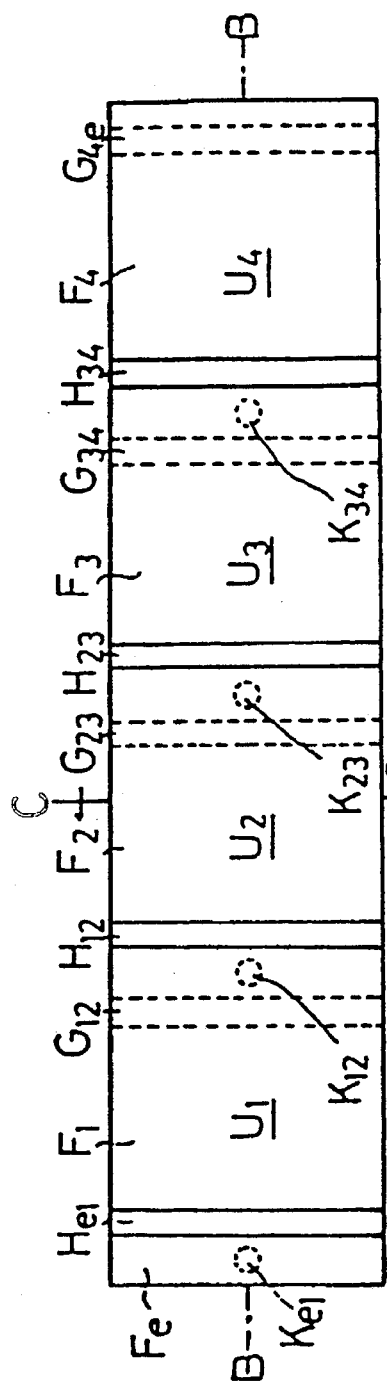
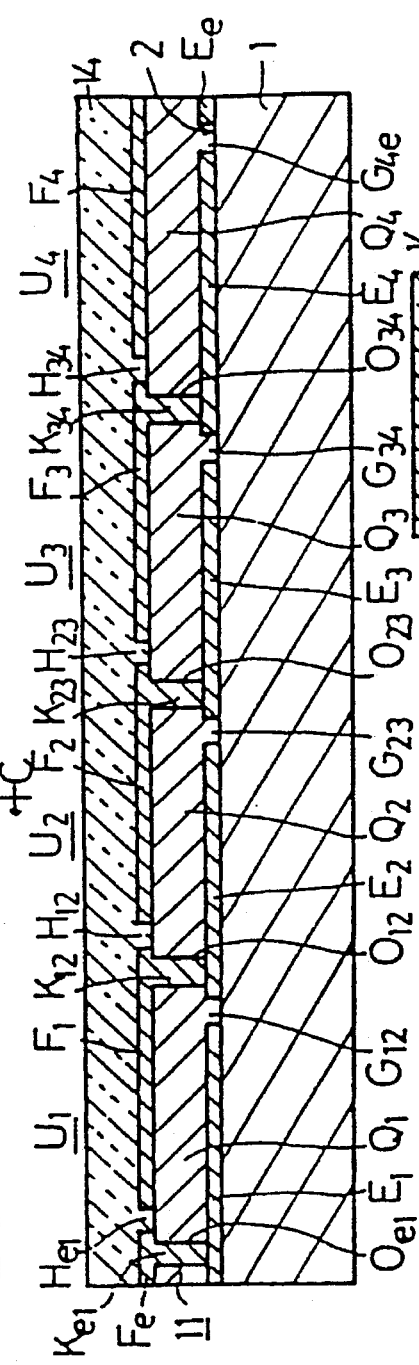
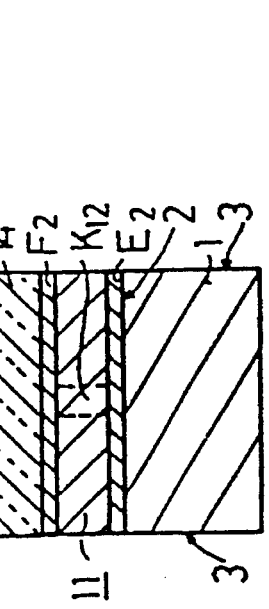
FIG. 9A
FIG. 9B
FIG. 9C

PHOTOELECTRIC CONVERSION DEVICE

This is a Divisional application of Ser. No. 08/222,954, filed Apr. 5, 1994; which itself is a division of Ser. No. 08/013,209, filed Feb. 1, 1993 now U.S. Pat. No. 5,332,450; which itself was a continuation of Ser. No. 07/839,067, filed Feb. 20, 1992 now abandoned, which itself was a continuation of Ser. No. 06/800,666, filed Nov. 22, 1985 now abandoned; which is a division of Ser. No. 06/630,063, filed Jul. 12, 1984, now U.S. Pat. No. 4,594,471.

BACKGROUND OF THE INVENTION

1. Field of the Invention

The present invention relates to improvement in a photoelectric conversion device which has a plurality of sequentially series-connected semiconductor transducers and its manufacturing method.

2. Description of the Prior Art

As A photoelectric conversion device provided with a plurality of sequentially series-connected semiconductor transducers $U_1, U_2, \ldots$, there has been proposed a structure which comprises (a) a substrate having an insulating surface, (b) a plurality of first electrodes $E_1, E_2, \ldots$ formed side by side on the substrate, (c) a non-single-crystal semiconductor laminate member formed on the substrate to cover the first electrodes $E_1, E_2, \ldots$ and (d) a plurality of second electrodes $F_1, F_2, \ldots$ formed side by side on the non-single-crystal semiconductor layer in opposing relation to the first electrodes $E_1, E_2, \ldots$, respectively, and in which the semiconductor transducer $U_i$ (where i=1, 2 . . . ) is made up of the first electrode $E_i$, the second electrode $F_i$ and that region $Q_i$ of the non-single-crystal semiconductor laminate member which is sandwiched between the first and second electrodes $E_i$ and $F_i$, and the second electrode $F_i$ is connected to the first electrode $E_{i+1}$ through a contact portion $K_{i(i+1)}$. In such a conventional photoelectric conversion device, however, the contact portion $K_{i(i+1)}$, which interconnects the second electrode $F_i$ of the semiconductor transducer $U_i$ and the first electrode $E_{i+1}$ of the semiconductor transducer $U_{i+1}$, is comprised of, for example, an extension of the first electrode $E_{i+1}$ which is formed on the substrate and extends therefrom on the side wall along the direction of arrangement of the semiconductor transducers $U_1, U_2, \ldots$ and an extension of the second electrode $F_i$ which is formed on the non-single-crystal semiconductor laminate member and extends therefrom on the side wall along the direction of arrangement of the semiconductor transducers $U_1, U_2, \ldots$ and onto the substrate and thence to the extension of the first electrode $E_{i+1}$. Therefore, the contact portion $K_{i(i+1)}$ is complex in construction and there is a certain limit to decreasing the area of the substrate consumed by the contact portions. Accordingly, it is difficult to fabricate the conventional photoelectric conversion device with a simple construction and with a high density.

Further, in, the conventional photoelectric conversion device having the above construction, when forming the second electrode $F_i$ which has the extension forming the contact portion $K_{i(i+1)}$, together with the extension of the first electrode $E_{i+1}$, there is a fear of shorting the first and second electrodes $E_i$ and $F_i$ of the semiconductor transducer $U_i$ by the material forming the second electrode $F_i$, On account of this, it is difficult to obtain a photoelectric conversion device with the desired high photoelectric conversion efficiency.

Moreover, since it is feared that a significant leakage current flows between the first and second electrodes $E_i$ and $F_i$ of the semiconductor transducer $U_i$ through the side wall of the region $Q_i$ of the non-single-crystal semiconductor laminate member extending along the direction of arrangement of the semiconductor transducers $U_1, U_2, \ldots$, there is the likelihood that the conventional photoelectric conversion device cannot be operated with the required high photoelectric conversion efficiency.

Various methods have been proposed for the manufacture of the abovesaid photoelectric conversion device.

However, the prior art methods do not allow ease of manufacture of a closely-packed photoelectric conversion device of low leakage current and which achieves the intended high photoelectric conversion efficiency.

SUMMARY OF THE INVENTION

It is therefore an object of the present invention to provide a novel photoelectric conversion device which can easily be manufactured without incurring the possibility of the abovesaid defects, and a method for the manufacture of such a photoelectric conversion device.

The photoelectric conversion device of the present invention comprises a plurality of series-connected semiconductor transducers $U_1, U_2, \ldots$, as is the case with the abovementioned conventional photoelectric conversion device. The photoelectric conversion device of the present invention is comprised of (a) a substrate having an insulating surface, (b) a plurality of first electrodes $E_1, E_2, \ldots$ formed side by side on the substrate, (c) a non-single-crystal semiconductor laminate member formed on the substrate to cover the first electrodes $E_1, E_2, \ldots$ and (d) a plurality of second electrodes $F_1, F_2, \ldots$ formed on the non-single-crystal semiconductor laminate member in opposing relation to the first electrodes $E_1, E_2, \ldots$, respectively. Accordingly, the semiconductor transducer $U_i$ (where i=1, 2 . . . ) is constituted by the first electrode $E_i$, the second electrode $F_i$ and a region $Q_i$ of the non-single-crystal semiconductor laminate member which is sandwiched between the first and second electrodes $E_i$ and $F_i$, and the second electrode $F_i$ is connected to the first electrode $E_{i+1}$ through a contact portion $K_{i(i+1)}$.

In the photoelectric conversion device of the present invention which has such a structure as described above, the plurality of first electrodes $E_1, E_2, \ldots$ are respectively isolated from adjacent ones by a plurality of first isolation grooves $G_{12}, G_{23}, \ldots$ sequentially arranged in the direction of arrangement of the first electrodes. Further, non-single-crystal semiconductor laminate member extends into the plurality of first isolation grooves $G_{12}, G_{23}, \ldots$, and the plurality of second electrodes $F_1, F_2, \ldots$ are respectively isolated from adjacent ones by a plurality of second isolation grooves $H_{12}, H_{23}, \ldots$ sequentially arranged in the direction of arrangement of the second electrodes. The second isolation grooves $H_{i(i+1)}$ (where i=1, 2 . . . ) extend in opposing relation to a region of the first electrode $E_{i+1}$ on the side of the isolation groove $G_{i(i+1)}$, and consequently, second electrode $F_i$ is opposite to the region of the first electrode $E_{i+1}$ on the side of the isolation groove $G_{i(i+1)}$. In the region of the non-single-crystal semiconductor laminate member across which the second electrode $F_i$ is opposite to the first electrode $E_{i+1}$, there is cut a contact groove $O_{i(i+1)}$ which extends between the second electrode $F_i$ and the first electrode $E_{i+1}$. The second electrode $F_i$ extends, as the contact portion $K_{i(i+1)}$, through the contact groove $O_{i(i+1)}$ to reach the first electrode $E_{i+1}$.

With such a photoelectric conversion device of the present invention, the contact portion $K_{i(i+1)}$, which interconnects the second electrode $F_i$ of the semiconductor transducer $U_i$ and the first electrode $E_{i+1}$ of the semiconductor transducer $U_{i+1}$, is formed by an extention of the second electrode $F_i$ which fills the contact groove $O_{i(i+1)}$ cut in the non-single-crystal semiconductor laminate member between the second electrode $F_i$ and the first electrode $E_{i+1}$. Accordingly, the contact portion $K_{i(i+1)}$ is simple-structured as compared with the contact portion in the conventional photoelectric conversion device, and the area of the substrate occupied by the contact portion $K_{i(i+1)}$ can be made far smaller than in the past. Therefore, the photoelectric conversion device of the present invention can be formed with a simple construction and with a high density, as compared with the prior art devices.

According to an aspect of the present invention, the contact groove $O_{i(i+1)}$ does not extend to the side wall of the non-single-crystal semiconductor laminate member which is parallel to the direction of arrangement of the semiconductor transducers $U_1, U_2, \ldots$, so that the contact portion $K_{i(i+1)}$ does not extend to the abovesaid side wall of the non-single-crystal semiconductor laminate member, either.

With such a construction, it is possible to effectively eliminate the possibility of the first electrode $E_i$ and the second electrode $F_i$ of the semiconductor transducer $U_i$ being shorted by the material forming the contact portion $K_{i(i+1)}$ when the substrate assembly is severed along the direction of arrangement of the semiconductor transducers $U_1, U_2 \ldots$ into individual photoelectric conversion devices. This permits easy fabrication of photoelectric conversion devices of an intended high photoelectric conversion efficiency.

According to another aspect of the present invention, the side wall of the first electrode $E_i$ and/or the second electrode $F_i$ of the semiconductor transducer $U_i$, which extends along the direction of arrangement of the semiconductor transducers $U_1, U_2, \ldots$, lies inside the side edge of the substrate.

With such an arrangement, it is possible to effectively prevent leakage current from flowing between the first and second electrodes $E_i$ and $F_i$ of the semiconductor transducer $U_i$ through the side wall of the region $Q_i$ of the non-single-crystal semiconductor laminate member extending along the direction of arrangement of the semiconductor transducers $U_i, U_2, \ldots$ Also it is possible to effectively avoid shorting of the first and second electrodes $E_i$ and $F_i$ by the material of either one or both of them when the substrate assembly is severed along the direction of arrangement of the semiconductor transducers $U_1, U_2,$ into individual photoelectric conversion devices. This ensures that the photoelectric conversion device operates with an intended high photoelectric conversion efficiency without incurring any loss which results from the abovesaid leakage current. Furthermore, a photoelectric conversion device of the desired high photoelectric conversion efficiency can easily be produced.

The photoelectric conversion device manufacturing method of the present invention is intended for the manufacture of the photoelectric conversion device which is provided with the plurality of series-connected semiconductor transducers $U_1, U_2, \ldots,$ as described above.

This manufacturing method includes the steps of (a') forming a first conductive layer on a substrate having an insulating surface; (b') scribing the first conductive layer by a first laser beam to cut therein, a plurality of sequentially arranged first isolation grooves $G_{12}, G_{23}, \ldots,$ by which a plurality of sequentially arranged first electrodes $E_1, E_2, \ldots$ are formed on the substrate; (c') forming a non-single-crystal semiconductor laminate member on the substrate to cover the plurality of first electrodes $E_1, E_2, \ldots$ and to fill the plurality of first isolation grooves $G_{12}, G_{23}, \ldots ;$ (d') scribing the non-single-crystal semiconductor laminate member by means of a second laser beam to form contact grooves $O_{12}, O_{23}, \ldots$ thereby to expose therein the first electrodes $E_1, E_2, \ldots$ locally to the outside on the side of the first isolation grooves $G_{12}, G_{23}, \ldots,$ respectively; (e') forming, on the substrate, a second conductive layer which covers the non-single-crystal semiconductor laminate member and fills the contact grooves $O_{12}, O_{23}, \ldots$ to form contact portions $K_{12}, K_{23}, \ldots$ in contact with the first electrodes $E_2, E_3, \ldots,$ respectively; (f') scribing the second conductive layer by means of a third laser beam to cut therein second isolation grooves $H_{12}, H_{23}, \ldots,$ which correspond to the first isolation grooves $G_{12}, G_{23}, \ldots,$ respectively, on the opposite side therefrom with respect to the contact grooves $O_{12}, O_{23}, \ldots,$ by which are formed on the non-single-crystal semiconductor laminate member second electrodes $F_1, F_2, \ldots$ connected to the first electrodes $E_2, E_3, \ldots$ through the contact portions $K_{12}, K_{23}, \ldots,$ respectively.

According to an aspect of the manufacturing method of the present invention, in the step of forming the contact groove $O_{i(i+1)}$) (where $i=1, 2, \ldots$), it is formed so as not to extend to the side wall of the non-single-crystal semiconductor laminate member extending along the direction of arrangement of the semiconductor transducers $U_1, U_2, \ldots$ According to another aspect of the manufacturing method of the present invention, in the step of scribing the first conductive layer using the first laser beam, there is cut in the first conductive layer at least one third isolation groove which extends along the direction of arrangement of the semiconductor transducers $U_1, U_2, \ldots$ and in which is exposed at least one side of the first electrode $E_i$ (where $i=1, 2, \ldots$) extending along the direction of arrangement of the semiconductor transducers $U_1, U_2, \ldots,$ and/or in the step of scribing the second conductive layer by the third laser beam, there is cut in the second conductive layer at least one fourth isolation groove which extends along the direction of arrangement of the semiconductor transducers $U_1, U_2, \ldots$ and in which is exposed at least one side of the second electrode $F_i$ extending along the direction of arrangement of the semiconductor transducers $U_1, U_2, \ldots$ Such a manufacturing method of the present invention as described above permits easy fabrication of the photoelectric conversion device which has the aforementioned arrangement and the aforesaid features.

Other objects, features and advantages of the present invention will become more fully apparent from the detailed description taken in conjunction with the accompanying drawings.

BRIEF DESCRIPTION OF THE DRAWINGS

FIGS. 1A, B, and C are respectively a plan view schematically illustrating an embodiment of the photoelectric conversion device of the present invention, a sectional view taken on the line B—B, and a sectional view taken on the line C—C in FIG. 1A;

FIGS. 2, 3, 4, 5, 6, 7, and 8 are schematic diagrams showing a sequence of steps involved in the manufacture of the photoelectric conversion device of FIG. 1 in accordance with an embodiment of the manufacturing method of the present invention, FIGS. 2A, 4A to 8A being plan views, FIGS. 2B, 3, and 4B to 8B cross-sectional views, and FIG. 8C a longitudinal view; and FIGS. 9A, B, and C are respectively a plan view schematically illustrating another embodiment of the photoelectric conversion device of the present invention, a sectional view taken on the line B—B and a sectional view taken on the line C—C in FIG. 9A.

DESCRIPTION OF THE PREFERRED EMBODIMENTS

Figure 2A:
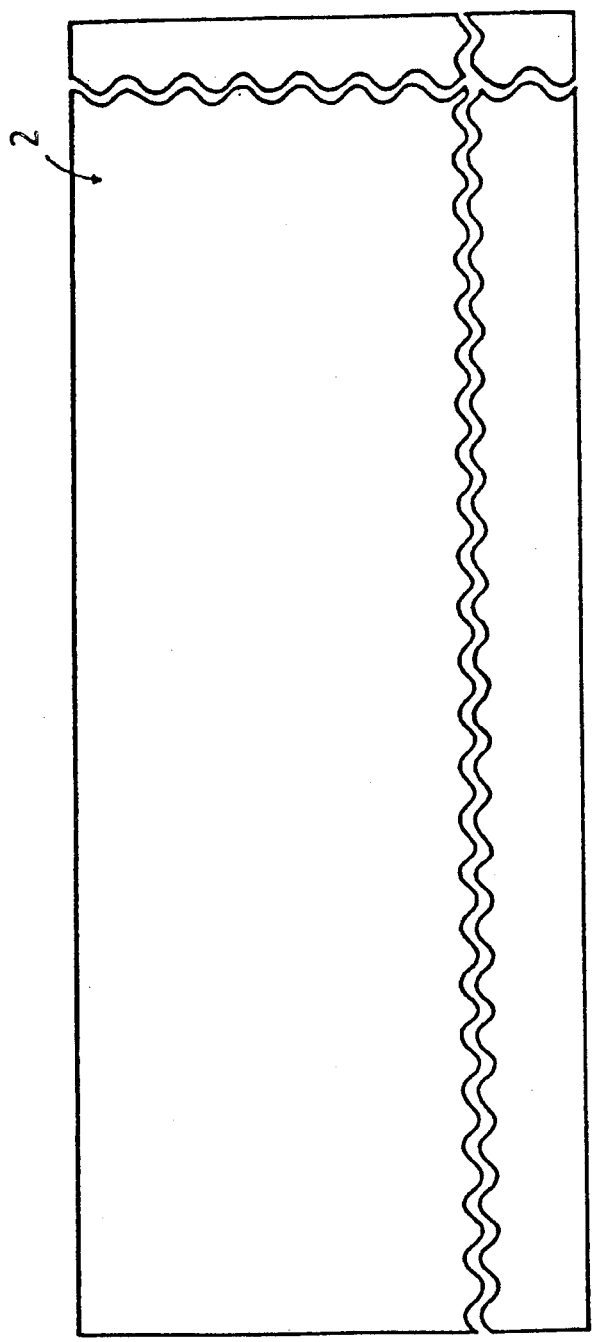

Referring first to FIGS. 1A to C, a first embodiment of the photoelectric conversion device of the present invention will be described.

The photoelectric conversion device of the present invention shown in FIGS. 1A to C is provided with, for example, four semiconductor transducers $U_1$ to $U_4$ which are sequentially connected in series, and has such an arrangement as follows:

Substrate 1 has a surface 2 of an organic or inorganic insulator. As such a substrate 1, for example, a synthetic resin substrate can be used which is transparent or nontransparent. It is also possible to employ a ceramic substrate, a transparent glass substrate and a substrate, which has an insulating film of synthetic resin, a silicon oxide, or the like, deposited on a stainless steel or metal plate.

The substrate 1 is rectangular-shaped.

On a main surface 2 of the substrate 1 there are formed side by side four first electrodes $E_1$ to $E_4$.

Each of the electrodes $E_1$ to $E_4$ has a thickness of 1 μm or less.

The first electrode $E_i$ (i=1, 2, ...) may be formed as a transparent conductive layer. In this case, the substrate 1 is transparent. The first electrode $E_i$ may be constituted principally of a sub-limable metallic oxide such as $SnO_2$, $In_2O_3$, or ITO (Indium-Tin oxide), or a sublimable metallic nonoxide material such as a Si-Cr or Si-Ni alloy.

The first electrode $E_i$ may also be formed as a nontransparent conductive layer. In such a case, the substrate 1 need not be transparent. The nontransparent first electrode $E_i$ may be constituted principally of a sublimable metal such as Cr, a Cr-Cu alloy (containing 0.1 to 50 wt % of Cu), a Cr-Ag alloy (containing 0.1 to 50 wt % of Ag), a Cr-N alloy (containing 0.1 to 50 wt % of N), or a nonsublimable metal such as Al, Cu, or Ag.

Further, the first electrode $E_i$ may also be a laminate member which comprises a transparent conductive layer constituted principally of the abovesaid sublimable metallic oxide or sublimable metallic nonoxide and a nontransparent conductive layer constituted principally of the abovesaid sublimable metal or nonsublimable metal. In this case, the nontransparent conductive layer is formed on the side of the substrate 1, and the substrate 1 need not be transparent.

The electrode $E_i$ is, for example, rectangular in shape and has a width of 5 to 40 mm, preferably 15 mm, and a length slightly smaller than the length of the substrate 1.

The electrodes $E_i$ and $I_{i+1}$ are spaced apart by a groove $G_{i(i+1)}$ which is shown to extend in the vertical direction in FIG. 1A. The groove $G_{i(i+1)}$ is, for example, 40 μm wide.

On the main surface 2 of the substrate 1 there is formed on the side of electrode $E_4$ which is opposite to the electrode $E_3$ another electrode $E_e$ which is similar to the first electrode $E_i$ and is separated from the electrode $E_4$ by an isolation groove $G_{4e}$ similar to the abovesaid isolation groove $G_{i(i+1)}$.

Further, the substrate 1 has opposite side walls 3 and 3' which extend along the direction of arrangement of the semiconductor transducers $U_1, U_2, \ldots$, and on the marginal portion of the main surface 2 of the substrate 1 hear the side wall 3 thereof, there are formed electrodes $C_1, C_2, \ldots$ and $C_e$ which are similar to the electrodes $E_1, E_2, \ldots$ and separated therefrom by an isolation groove 5 $E_e$ similar to $G_{i(i+1)}$ and extending in the direction of semiconductor transducers $U_1, U_2, \ldots$. Likewise, there are formed on the marginal portion of the main surface 2 of the substrate 1 the side wall 3' thereof electrodes $C_1', C_2', \ldots$ and $C_e'$ which are similar to those $E_1, E_2, \ldots$ and $E_e$ but separated therefrom by an isolation groove 5' similar to 5. The electrodes $C_i$ and $C_{i+1}$ are isolated by an extension of the isolation groove $G_{i(i+1)}$ in the direction of arrangement of the semiconductor transducers $U_1, U_2, \ldots$, and similarly, the electrodes $C_i'$ and $C_{i+1}'$ are isolated by the isolation groove $G_{i(i+1)}$. The electrodes $C_4$ and $C_e'$ and $C_4'$ and $C_e'$ are isolated by the isolation groove $G_{4e}$.

The isolation grooves 5 and 5' expose those side walls 6 and 6' of the electrodes $E_i$ and $E_e$ which extend along the direction of arrangement of the semiconductor transducers $U_1, U_2, \ldots$, and consequently, these side walls 6 and 6' are inside the side walls 3 and 3' of the substrate 1, respectively.

A non-single-crystal semiconductor laminate member 11 is formed on the main surface 2 of the substrate 1 to cover the electrodes $E_1, E_2, \ldots E_e, C_1, C_2, \ldots C_e$ and $C_1', \ldots C_e'$ and to fill the isolation grooves $G_{12}, G_{23}, \ldots G_{4e}$, 5 and 5'.

The non-single-crystal semiconductor laminate member 11 also has a thickness of 1 μm or less.

The non-single-crystal semiconductor laminate member 11 has a PN junction structure wherein a P-type non-single-crystal semiconductor layer and N-type non-single-crystal semiconductor layer are laminated one on the other in this order or in the reverse order, or a PIN junction structure wherein a P-, I- and N-type non-single-crystal semiconductor layers are laminated one on another in this order or in the reverse order.

The non-single-crystal semiconductor laminate member 11 may be constituted mainly of a sublimable semiconductor such as Si, $Si_xGe_{1-x}$ (where 0<x<0.5), $Si_xC_{1-x}$ (where 0<x<1), $Si_3N_{4-x}$ (where 0<x<2) or $SiO_{2-x}$ (where 0<x<1), and the laminate member 11 has introduced therein hydrogen or a halogen as a dangling bond neutralizer.

On the non-single-crystal semiconductor laminate membr 11 there are provided electrodes $F_1, F_2, \ldots$ which are sequentially arranged in opposing relation to the electrodes $E_1, E_2, \ldots$, respectively.

The electrode $F_i$ also has a thickness of 1 μm or less.

The electrode $F_i$ may be formed as a transparent conductive layer which is constituted principally of the sublimable metallic oxide or sublimable metallic nonoxide mentioned previously with regard to the electrodes $E_1$ to $E_4$. In this case, the substrate 1 need not be transparent.

The electrode $F_i$ may also be formed as a non-transparent conductive layer which is constituted principally of the aforesaid sublimable metal. In such a case, the substrate 1 is transparent.

Moreover, the electrode $F_i$ may also be formed as a laminate member which composed of a transparent conductive layer constituted mainly of the aforesaid sublimable metallic oxide or sublimable metallic nonoxide and a nontransparent conductive layer which is constituted mainly of the aforementioned sublimable or nonsublimable metal. In this case, the transparent conductive layer is formed on the side of the non-single-crystal semiconductor laminate member 11, and the substrate 1 is transparent.

The electrodes $F_1, F_2, \ldots$ are separated from adjacent ones along the-direction of their arrangement by isolation grooves $H_{12}, H_{23}, \ldots$ which are similar to the aforementioned groove. $G_{i(i+1)}$. In this case, the isolation groove $H_{i(i+1)}$ extends in opposing relation to the region of the electrode $E_{i+1}$ on the side of the isolation groove $G_{i+1}$. Accordingly, the electrode $F_i$ is opposite to the region of the electrode $I_{i+1}$ on the side of the isolation groove $G_{i(i+1)}$, but the electrode $F_4$ is opposite to the electrode $E_e$.

On the non-single-crystal semiconductor laminate member 11, there is provided on the side opposite from the electrode $F_2$ with respect to the electrode $F_1$ another electrode $F_e$ which is similar to $F_i$ and is separated from the electrode $F_1$ by an isolation groove $H_{e1}$ similar to the abovesaid one $H_{i(i+1)}$.

Furthermore, there are mounted on the marginal portion of the non-single-crystal semiconductor laminate member 11 near the side wall 3 of the substrate 1 electrodes $D_1$, $D_2$, . . . and $D_e$ which are similar to the electrodes $C_1$, $C_2$, . . . and $C_e$ but separated therefrom by an isolation groove 12 similar to the abovesaid groove 5. Likewise, there are provided on the marginal portion of the non-single-crystal semiconductor laminate member 11 on the side of the side wall 3' of the substrate 1 electrodes $D_1'$, $D_2'$ and $D_e'$ which are similar to the electrodes $C_1'$, $C_2'$, . . . and $C_e'$ but separated therefrom by an isolation groove 12' which extends in the same direction as does the abovesaid groove 12. The electrodes $D_i$ and $D_{i+1}$ are isolated by an extension of the isolation groove $H_{i(i+1)}$ in the direction of arrangement the semiconductor transducers $U_1$, $U_2$, . . . , and similarly, the electrodes $D_i'$ and $D_{i1}'$ are isolated by the isolation groove $H_{i(i+1)}$. The electrodes $D_1$ and $D_e'$ and $D_1'$ and $D_e'$ are isolated by the isolation groove $H_{e1}$.

The isolation grooves 12 and 12' expose those side walls 13 and 13' of the electrodes $F_i$, $F_2$ . . . and $Fe_e$ which extend along the direction of arrangement of the semiconductor transducers $U_1$, $U_2$, . . . , and consequently, these side walls 13 and 13' are inside the side walls 3 and 3' of the substrate 1, respectively.

In the region of the non-single-crystal semiconductor laminate member 11 which is sandwiched between the electrodes $F_i$ and $I_{i+1}$, there is formed a contact groove $O_{i(i+1)}$ which extends between them. Similarly, in the region of the non-single-crystal semiconductor laminate member 11 which is sandwiched between the electrodes $F_e$ and $E_1$, there is formed a contact groove $O_{e1}$ which extends between them. The electrodes $F_i$ and $F_e$ extend, as contact portions $K_{i(i+1)}$ and $K_{e1}$, through the contact portions $O_{i(i+1)}$ and $O_{e1}$ for contact with the electrodes $E_{i+1}$ and $E_1$, respectively.

The electrodes $E_i$ and $F_i$ and the region $Q_i$ of the non-single-crystal semiconductor laminate member 11 across which the electrodes $E_i$ and $F_i$ are opposite to each other constitute the semiconductor transducer $U_i$, which is connected in series to the semiconductor transducer $U_{i+1}$ through the contact portion $K_{i(i+1)}$.

A protective film 14 is provided which covers the electrodes $F_1$, $F_2$, . . . $F_e$, $D_1$, $D_2$, . . . $D_e$ and $D_1'$, $D_2'$, . . . $D_e'$ and fills the isolation grooves $H_{12}$, $H_{23}$, . . . $H_{e1}$. The protective film 14 may be formed of synthetic resin. When the substrate 1 is nontransparent, the protective film 14 is transparent, but when the former is transparent, the latter need not be transparent.

With the photoelectric conversion device of such an arrangement according to the present invention, the contact portion $K_{i(i+1)}$ is simple in construction and the area of the substrate occupied by the contact portion can be decreased, as described previously.

As will become apparent from a description given later of an embodiment of the photoelectric conversion device manufacturing method of the present invention, since the contact portion $K_{i(i+1)}$ is entirely surrounded by the non-single-crystal semiconductor laminate member 11, it is possible to effectively eliminate the possibility of the electrodes $E_i$ and $F_i$ of the semiconductor transducers $U_i$ being shorted by the material of the contact portion $K_{i(i+1)}$ when the substrate assembly is severed along the direction of arrangement of the semiconductor transducers $U_1$, $U_2$, into individual photoelectric conversion devices.

Further, since the side walls 6, 6' and 13, 13' of the electrodes $E_i$ and $F_i$ of the semiconductor transducer $U_i$ are exposed in the isolation grooves 5, 5' and 12, 12' respectively, and are inside of the side walls 3 and 3' of the substrate 1, no leakage current flows between the electrodes $E_i$ and $F_i$ through the side walls of the non-single-crystal semiconductor laminate member 11, and there is no fear of shorting of the electrodes $E_i$ and $F_i$ through the material of either of them even in the case of severing the substrate assembly into individual photoelectric conversion devices.

Accordingly, the photoelectric conversion device of the present invention, shown in FIG. 1, is able to achieve an intended high photoelectric conversion efficiency and can easily be manufactured with a high density.

Turning next to FIGS. 2 to 8, an embodiment of the manufacturing method of the present invention will hereinafter be described as being applied to the manufacture of the photoelectric conversion device described above in connection with FIG. 1.

In FIGS. 2 to 8, the parts corresponding to those in FIG. 1 are identified by the same reference numerals, and no detailed description will be repeated.

Figure 2B:
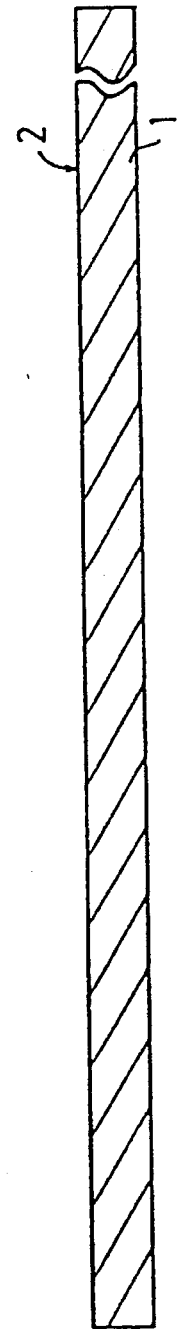

The manufacture starts with the preparation of the substrate 1 having the insulating surface 2 (FIG. 2).

Figure 3:
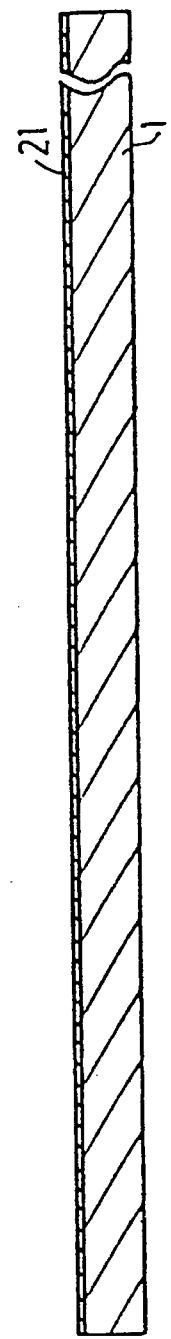

Then a conductive layer 21 of the same material and structure as the electrode $E_i$ is formed by a known evaporation or CVD method on the surface 2 of the substrate 1 (FIG. 3).

Next, the conductive layer 21 is scribed by a laser beam to cut vertically therein a plurality of sets of isolation grooves $G_{12}$, $G_{23}$, $G_{34}$, and $G_{4e}$ of a width substantially equal to the diameter of the laser beam and which are sequentially arranged in the lateral direction (FIG. 4). At the same time, the conductive layer 21 is scribed to cut therein laterally a plurality of pairs of isolation grooves 5 and 5' of the same width as the isolation groove $G_{i(i+1)}$ which are sequentially arranged in the lengthwise direction. In other words, by patterning the conductive layer 21 with the laser beam, a plurality of sets of electrodes $E_1$ to $E_4$ and $E_e$ are formed in a matrix form on the substrate 1, and at the same time, pluralities of sets of electrodes $C_1$ to $C_4$ and $C_e$ and sets of electrodes $C_1$ to $C_4'$ and $C_e'$ are formed in the matrix form. In this case, the electrode $E_e$ of one of two laterally adjoining sets of the electrodes $E_1$ to $E_4$ and $E_e$ is connected to the electrode $E_1$ of the other set.

Further, the electrode $C_e$ of one of two laterally adjoining sets of electrodes $C_1$ to $C_4$ and $C_e$ is connected to the electrode $C_1$ of the other set, and in a similar fashion, the electrode $C_e'$ of one of two adjacent sets of electrodes $C_1'$ to $C_4'$ and Ce' is connected to the electrode $C_1'$ of the other set.

Furthermore, two sets of electrodes $C_1$ to $C_4$ and $C_e$ and $C_1'$ to $C_4'$ and $C_e'$ which are adjacent to each other in the vertical direction, bear such a relation that the electrodes $C_1$ to $C_4$ and $C_e$ of the former set are connected to the electrodes $C_1'$ to $C_4'$ and $C_e'$ of the latter set, respectively.

The laser beam used in this case may be a pulsed laser beam that has a short wavelength of 600 nm or less, a spot diameter of 3 to 60 μm and duration of 50 nano-seconds or less.

As the pulsed laser bean, a pulsed laser beam of a 530 nm or so wavelength can be used which is obtainable with a YAG laser. It is also possible to employ a pulsed laser beam of 193 nm or so (ArF), 248 nm or so (KrF), 308 nm or so (XeCl), or 315 nm or so (XeF) wavelength which is obtainable with an excimer laser, a laser beam of a 514.5 nm or so, 488 nm or so, 458 nm or so, 363 nm or so or 351 nm or so, wavelength which is obtainable with an argon laser, or a laser beam of a 337 nm or so wavelength which is obtainable with a nitrogen laser.

Also it is possible to use a pulsed laser beam of such a long wavelength as about 1060 nm which is obtainable with a YAG laser.

When the laser beam has a short wavelength of 600 nm or less, the absorption coefficient of the electrode $E_i$ for the laser beam is more than 100 times larger than the absorption coefficient for a laser beam having a long wavelength of about 1060 nm which is obtainable with a YAG laser. Accordingly, the conductive layer 21 is effectively heated by the laser beam locally at the position of its irradiation. On the other hand, since the conductive layer 21 is as thin as 1 μm or less, it does not unnecessarily transfer therethrough heat resulting from the irradiation by the laser beam, namely, the heat generated in the conductive layer 21 does not unnecessarily escape therefrom to outside through the conductive layer 21 itself. Moreover, the substrate 1 has an insulating surface, and hence it also prevents heat generated in the conductive layer 21 from unnecessarily escaping therefrom to the outside through the substrate 1. Accordingly, the material of the conductive layer 21 is effectively sublimed at the position of irradiation by the laser beam. As a result of this, electrodes $E_i$ are neatly formed, along with the grooves. In this case, there is no possibility that the material of the conductive layer 21, molten by the laser beam irradiation, is deposited on the marginal edges of the electrode $E_i$. Further, since the laser beam is effectively absorbed by the conductive layer 21 because of its short wavelength, it does not inflict on the substrate 1 unnecessary damages such as depressions and cracks. The effects described just above are prominent especially when the conductive layer 21 is a transparent conductive layer which is constituted principally of the aforementioned sublimable metallic oxide or sublimable metallic nonoxide, a nontransparent conductive layer which is constituted principally of the aforesaid sublimable metal, or a laminate member composed of such transparent and nontransparent conductive layers. Incidentally, even if the conductive layer 21 is a nontransparent conductive layer which is constituted principally of the aforementioned nonsublimable metal, or a laminate member comprised of the abovesaid transparent conductive layer and the nontransparent conductive layer which is constituted mainly of the aforementioned nonsublimable metal, the substrate 1 is not damaged because it has an insulative surface.

Next, a non-single-crystal semiconductor laminate member 11 is formed, by a known CVD, low-pressure CVD, plasma or glow discharge method, on the substrate 1 so that it covers the electrodes $E_1$ to $E_4$ and $E_e$, $C_1$ to $C_4$ and $C_e$, and $C_1'$ to $C_4'$ and $C_e'$ extends into the grooves $G_{12}$ $G_{23}$, $G_{34}$, and $G_{4e}$,'5 and 5' (FIG. 5).

The non-single-crystal semiconductor layer 11 also has a thickness of 1 μm or less.

Next, the non-single-crystal semiconductor laminate member 11 is irradiated by a laser beam to cut therein in a matrix form a plurality of sets of contact grooves $O_{e1}$, $O_{12}$, $O_{23}$, and $O_{34}$ of a width substantially equal to the diameter of the laser beam (FIG. 6).

In this case, the grooves $O_{e1}$, $O_{12}$, $O_{23}$, and $O_{34}$ are formed to expose electrodes $E_1$, $E_2$, $E_3$, and $E_4$. The formation of contact grooves $O_{e1}$ and $O_{i(i+1)}$ in the non-single-crystal semiconductor layer 11 is effected through use of the same laser beam as that for the formation of the electrodes $E_i$, $E_e$, $C_i$, $C_e$, $C_i'$ and $C_e'$. Therefore, no detailed description will be repeated.

When the laser beam used has such a short wavelenght as 600 nm or less, the absorption coefficient of the non-single-crystal semiconductor laminate member 11 for the laser beam is also large as is the case with the aforementioned conductive layer 21. Therefore, the non-single-crystal semiconductor laminate member 11 is effectively heated at the position of irradiation by the laser beam as in the case of the aforementioned conductive layer 21. Further, since the non-single-crystal semiconductor laminate member 11 is as thin as 1 μm or less, it does not transfer laterally therethrough the heat generated therein, thereby preventing the heat from unnecessarily escaping from the laminate member 11 to the outside, as described previously. Moreover, the non-single-crystal semiconductor laminate member I 1 is constituted principally of the sublimable semiconductor, as referred to previously. This enables the contact grooves $O_{i(i+1)}$ and $O_{e1}$ to be formed neatly, and ensures prevention of the material of non-single-crystal semiconductor layer 11, molten by the laser beam irradiation, from being deposited on marginal edges of the contact grooves $O_{i(i+1)}$ and $O_{e1}$, and that the electrodes $E_i$ and $E_e$ are hollowed, by the laser beam, to form therein a deep depression which may sometimes reach the substrate 1. Next, a conductive layer 41 is formed on the substrate 1 to cover the non-single-crystal semiconductor laminate member 11. The conductive layer 41 has contact portions $K_{e1}$, $K_{12}$, $K_{23}$, and $K_{34}$ which extend through the contact grooves $O_{e1}$, $O_{12}$, $O_{23}$, and $O_{34}$ and down to the electrodes $E_1$, $E_2$, $E_3$, and $E_4$ of the corresponding sets, respectively. The conductive layer 41 is of the same material and construction as the electrode $F_i$.

Figures 8A, 8B, 8C:
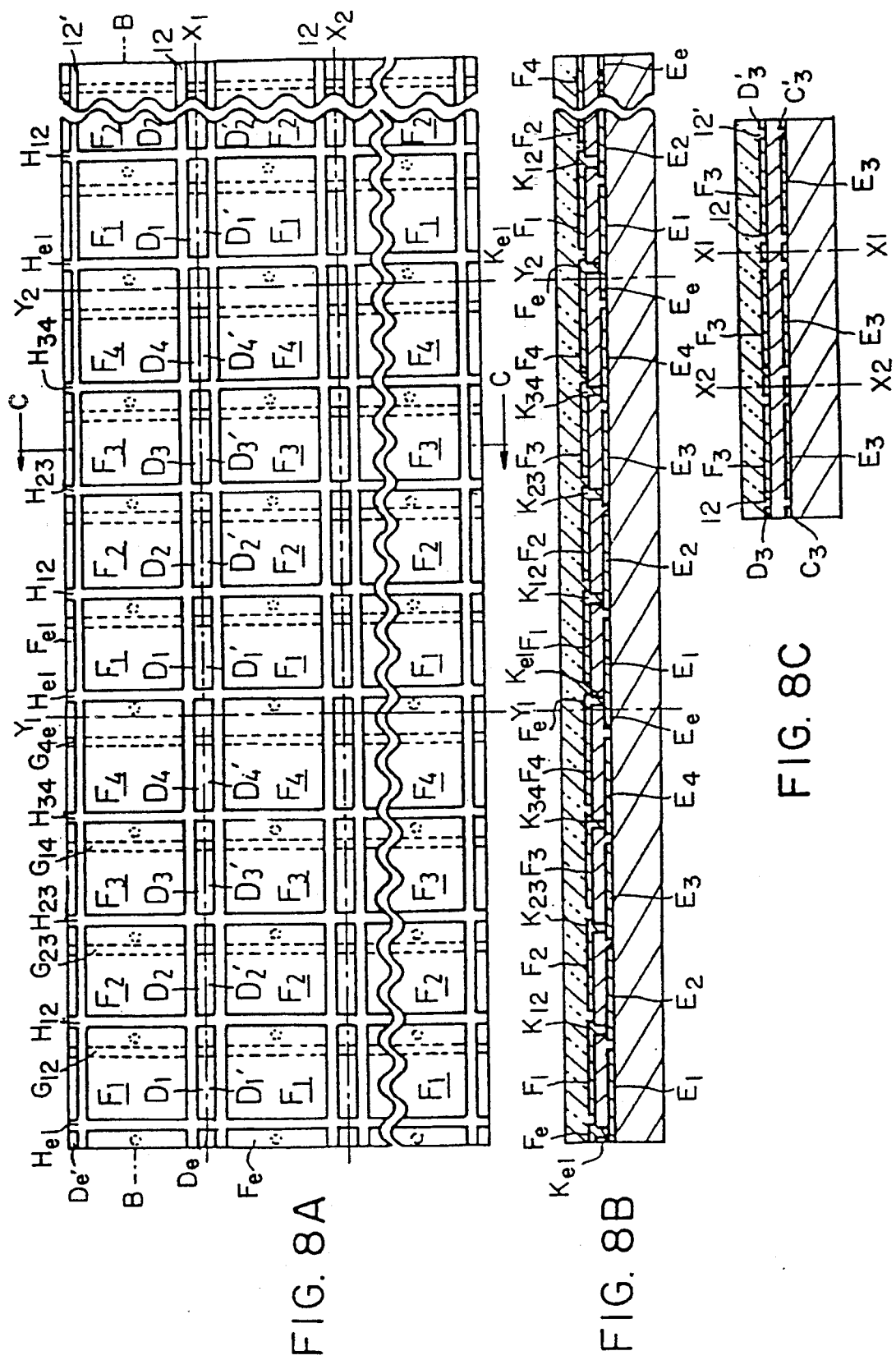

Next, the conductive layer 41 is scribed by a laser beam to cut vertically therein a plurality of sets of isolation grooves $H_{12}$, $H_{23}$, $H_{34}$, and $H_{4e}$ of a width substantially equal to the diameter of the laser beam and which are sequentially arranged in the widthwise direction (FIG. 8). At the same time, the conductive layer 41 is scribed to cut therein laterally a plurality of pairs of isolation grooves 12 and 12' of the same width as the isolation grooves $H_{i(i+1)}$ and $H_{4e}$ which are sequentially arranged in the lengthwise direction. In other words, by patterning the conductive layer 41 with the laser beam, a plurality of sets of electrodes $F_1$ to $F_4$ and $F_e$ are formed in a matrix form on the substrate 1, and at the same time, pluralities of sets of electrodes $D_1$ to $D_4$ and $D_e$ and sets of electrodes $D_1'$ to $D_4'$ and $D_e'$ are formed in a matrix form.

In this case, electrode $F_e$ of one of two laterally adjoining sets of the electrodes $F_1$ to $F_4$ and $F_e$ is connected to the electrode $E_e$ of the other set.

Further, the electrode $D_4$ of one of two laterally adjoining sets of electrodes $D_1$ to $D_4$ and $D_e$ is connected to the electrode $D_e$ of the other set, and in a similar fashion, the electrode $D_e'$ of one of two adjacent sets of electrodes $D_1'$ to $D_4'$ and $D_e'$ is connected to the electrode $C_e'$ of the other set.

Furthermore, two sets of electrodes $D_1$ to $D_4$ and $D_e$ and $D_1'$ to $D_4'$ and $D_e'$ which are adjacent to each other in the vertical direction, bear such a relation that the electrodes $D_1$ to $D_4$ and $D_e$ of the former set are connected to the electrodes $D_1'$ to $D_4'$ and $D_e'$ of the latter set, respectively.

The laser beam used for the patterning of the conductive layer 41 into the electrodes $F_i$ and $F_e$, $D_i$ and $D_e$, and $D_i'$ and $D_e'$ is the same as that for the formation of the $E_i$ and $E_e$, $C_i$ and $C_e$, and $C_i'$ and $C_e'$. Therefore, no detailed description will be repeated.

The absorption coefficient of the conductive layer 41 for such a laser beam of a 600 nm or less wavelength is large, as described previously in connection with the conductive layers 21 and the non-single-crystal semiconductor layers 11. On the other hand, the conductive layer 41 is thin and its portion on the side of the non-single-crystal semiconductor layer 11 is constituted mainly of the sublimable metallic oxide, sublimable metallic nonoxide, or sublimable metal, so that the electrodes $F_i$ and $F_e$, $D_i$ and $D_e$ and $D_i'$ and $D_e'$ are neatly formed, along with the grooves $H_{ei}$ and $H_{i(i+1)}$. That is to say, there is no possibility that the underlying non-single-crystal semiconductor layers 11 are hollowed, by the laser beam, to form therein deep depressions which may at a future time reach the underlying electrodes $E_i$, and that the electrodes $F_i$ and $F_e$, $D_i$ and $D_e$, and $D_i'$ and $D_e'$ are exfoliated at their marginal edges. Next, the protective film 14 which covers the electrodes $F_i$ and $D_i$ and $D_e$, and $D_i'$ and $D_e'$ and extends into the grooves $H_i$ and $H_e$, is formed by a known method.

Next, the substrate assembly is cut as by a laser beam along laterally and vertically extending cutting lines $X_1$, $X_2$, ... and $Y_1$, $Y_2$ ... into a plurality of such photoelectric conversion device as described previously with respect to FIG. 1.

The cutting lines $Y_1$, $Y_2$, ... each pass through a position where the electrode $E_e$ of one set of electrodes $E_1$ to $E_4$ and $E_e$ and the electrode $E_1$ of another set of electrodes $E_1$ to $E_4$ and $E_e$ adjacent thereto in the lateral direction are interconnected and a position where the electrode $F_4$ of one set of electrodes $F_1$ to $F_4$ and the electrode $F_e$ of another set of electrodes $F_1$ to $F_4$ adjacent thereto in the lengthwise direction are interconnected. The cutting line $X_1$, $X_2$, ... each pass through a position where the electrodes $C_1$ to $C_4$ and $C_e$ of one electrode set consisting thereof and the electrodes $C_1'$ to $C_4'$ and $C_e'$ of another electrode set consisting thereof and adjacent to the above electrode set in the widthwise direction are interconnected and a position where the electrodes $D_1$ to $D_4$ and $D_e$ of one electrode set consisting thereof and the electrodes $D_1'$ to $D_4'$ and $D_e'$ of another electrode set consisting thereof and adjacent the abovesaid electrode set in the widthwise direction are interconnected.

In this case, by cutting the substrate assembly along the cutting lines $Y_1$, $Y_2$, ... into individual devices, outer side walls are defined along the vertical cutting lines in connection with only the electrodes $E_1$ and $E_4$ of the electrodes $E_1$ to $E_4$ and $F_1$ to $F_4$ which are disposed at the opposite ends of each device, but no such side walls are formed with regard to the other electrodes $E_2$ to $E_4$ and $F_1$ to $F_3$. Also by cutting a long the cutting lines $X_1$, $X_2$ ..., no such side walls are formed along the lengthwise cutting lines with respect to the electrodes $E_1$ to $E_4$ and $F_1$ to $F_4$. This eliminates the possibility of shorting of the electrodes $E_i$ and $F_i$ by the materials thereof, even if the abovesaid cutting is effected by a laser beam. Further, by cutting along the cutting lines $X_1$, $X_2$, ..., the non-single-crystal semiconductor laminate member 11 is cut, but neither of the contact portions $K_{ei}$ and $K_{i(i+1)}$ are cut. On account of this, even if the abovesaid cutting is effected by a laser beam, there is no possibility that the material of the contact portion $K_{i(i+1)}$ enters into that region of the non-single-crystal semiconductor laminate member defined between the electrodes $E_i$ and $I_{i+1}$ on the side of the latter, resulting in shorting of the electrodes $E_i$ and $F_i$ through the abovesaid material and the contact portion $K_{i(i+1)}$.

While the foregoing description has been given of only one embodiment of each of the photoelectric conversion device and its manufacturing method according to the present invention, it is also possible to dispense with the isolation grooves 12, 12', 5 and 5' and the electrodes $C_1$ to $C_e$, $C_1'$ to $C_4'$ and $C_e'$, as shown in FIG. 9 which corresponds to FIG. 1.

Although the foregoing description has been given of the case where the contact groove $O_{i(i+1)}$ is circular and single, it is also possible to provide the contact groove $O_{i(i+1)}$ in a square, rectangular, or elliptic form, and two or more such grooves-may also be provided. Furthermore, the contact groove $O_{i(i+1)}$ may also be formed to extend between the side walls 3 and 3' of the substrate 1, as viewed from above. Also it is possible that the isolation groove $H_{i(i+1)}$ be formed to extend into the non-single-crystal semiconductor laminate member 11 and, in some cases, to the electrode $E_i$. Moreover, the contact groove $O_{i(i+1)}$ may also be formed to extend into the electrode $E_{i+1}$ and, in some cases, to the substrate 1.

It will be apparent that many modifications and variations may be effected without departing from the scope of the novel concepts of the present invention.

What is claimed is:

1. A photoelectric conversion device comprising:

a substrate having an insulating surface thereon; and a plurality of photoelectric conversion cells formed on said substrate and connected in series in one direction, each of said photoelectric cells comprising a first electrode formed on said substrate, a semiconductor layer formed on said first electrode, and a second electrode formed on said semiconductor layer, said first electrodes having side edges extending along said one direction, said second electrodes having side edges extending along said one direction, wherein said semiconductor layer extends beyond the side edges of at least said first electrodes and series electrical between connection first and second electrodes of adjacent cells is made at an inner portion of said semiconductor layer between side edges of said semiconductor layer extending along said one direction.

2. The device of claim 1 wherein said side edges of the first electrodes are parallel with said side edges of the second electrodes.

3. A photoelectric conversion device comprising:

a substrate having an insulating surface thereon; and a plurality of photoelectric conversion cells formed on said substrate and connected in series in one direction, each of said photoelectric cells comprising a first electrode formed on said substrate, a semiconductor layer formed on said first electrode, and a second electrode formed on said semiconductor layer, said first electrodes having side edges extending along said one direction, said second electrodes having side edges extending along said one direction, wherein said semiconductor layer extends beyond the side edges of at least said second electrodes series electrical connection between said first and second electrodes of adjacent cells is made at an inner portion of said semiconductor layer between side edges of said semiconductor layer extending along said one direction.

4. A photoelectric conversion device comprising:

a substrate having an insulating surface thereon; and a plurality of photoelectric conversion cells formed on said substrate and connected in series in one direction, each of said photoelectric cells comprising a first electrode formed on said substrate, a semiconductor layer formed on said first electrode, and a second electrode formed on said semiconductor layer, said first electrodes having side edges extending along said one direction, said second electrodes having side edges extending along said one direction, wherein said semiconductor layer extends beyond the side edges of both of said first and second electrodes and series electrical connection between said first and second electrodes of adjacent cells is made at an inner portion of said semiconductor layer between side edges of said semiconductor layer extending along said one direction.

5. A photoelectric conversion device comprising:

a substrate having an insulating surface thereon; and a plurality of photoelectric conversion cells formed on said substrate and connected in series in one direction, each of said photoelectric cells comprising a first electrode formed on said substrate, a semiconductor layer formed on said first electrode, and a second electrode comprising a conductive material formed on said semiconductor layer, wherein series connection of adjacent photoelectric conversion cells is made via an interconnect electrode extending through an opening formed within said semiconductor layer, said first electrodes having side edges extending along said one direction, said second electrodes having side edges extending along said one direction, wherein said semiconductor layer extends beyond the side edges of at least said first electrodes and said conductive material constituting said second electrodes extends into said opening within the semiconductor layer to form said interconnect electrode at least partly.

6. A photoelectric conversion device comprising:

a substrate having an insulating surface thereon; and a plurality of photoelectric conversion cells formed on said substrate and connected in series in one direction, each of said photoelectric cells comprising a first electrode formed on said substrate, a semiconductor layer formed on said first electrode, and a second electrode comprising a conductive material formed on said semiconductor layer, wherein series connection of adjacent photoelectric conversion cells is made via an interconnect electrode extending through an opening formed within said semiconductor layer, said first electrodes having side edges extending along said one direction, said second electrodes having side edges extending along said one direction, wherein said semiconductor layer extends beyond the side edges of at least said second electrodes and said conductive material constituting said second electrodes extends into said opening within the semiconductor layer to form said interconnect electrode at least partly.

7. A photoelectric conversion device comprising:

a substrate having an insulating surface thereon; and a plurality of photoelectric conversion cells formed on said substrate and connected in series in one direction, each of said photoelectric cells comprising a first electrode formed on said substrate, a semiconductor layer formed on said first electrode, and a second electrode comprising a conductive material formed on said semiconductor layer, wherein series connection of adjacent photoelectric conversion cells is made via an interconnect electrode extending through an opening formed within said semiconductor layer, said first electrodes having side edges extending along said one direction, said second electrodes having side edges extending along said one direction, wherein said semiconductor layer extends beyond the side edges of both of said first and second electrodes and said conductive material constituting said second electrodes extends into said opening within the semiconductor layer to form said interconnect electrode at least partly.

8. The device of claim 7 wherein said interconnect electrode extends into said first electrodes.

* * * * *